US011336017B2

(12) United States Patent
Kenoun

(10) Patent No.: US 11,336,017 B2
(45) Date of Patent: May 17, 2022

(54) FOLDED PLANAR ANTENNA

(71) Applicant: Apple Inc., Cupertino, CA (US)

(72) Inventor: Robert Kenoun, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/961,359

(22) PCT Filed: Jan. 10, 2018

(86) PCT No.: PCT/US2018/013072
§ 371 (c)(1),
(2) Date: Jul. 10, 2020

(87) PCT Pub. No.: WO2019/139567
PCT Pub. Date: Jul. 18, 2019

(65) Prior Publication Data
US 2020/0350684 A1 Nov. 5, 2020

(51) Int. Cl.
*H03M 1/38* (2006.01)
*H01Q 9/04* (2006.01)
(Continued)

(52) U.S. Cl.
CPC ......... *H01Q 9/0414* (2013.01); *H01Q 1/2283* (2013.01); *H01Q 1/48* (2013.01); *H01Q 1/273* (2013.01)

(58) Field of Classification Search
CPC ...... H01Q 9/0414; H01Q 1/2283; H01Q 1/48; H01Q 1/273
(Continued)

(56) References Cited

U.S. PATENT DOCUMENTS 5,831,577 A 11/1998 Nichols et al.
8,081,116 B2 * 12/2011 Yoshioka .............. H01Q 5/364 343/700 MS
(Continued)

FOREIGN PATENT DOCUMENTS

CN 101512832 A 8/2009
CN 106207381 A 12/2016
(Continued)

OTHER PUBLICATIONS

International Search Report dated Oct. 2, 2018 for International Application No. PCT/US2018/013072.
(Continued)

*Primary Examiner* — Peguy Jean Pierre
(74) *Attorney, Agent, or Firm* — Eschweiler & Potashnik, LLC

(57) ABSTRACT

An antenna structure associated with a wireless communication device comprised of a plurality of structures configured to enable structural, functional or cosmetic functions associated with the device, is proposed in this disclosure. The antenna structure comprises a first plate comprised of a first set of structures of the plurality of structures of the device and a second, different, plate comprised of a second set of structures of the plurality of structures of the device. The antenna structure further comprises an excitation component coupled between the first plate and the second plate. In some embodiments, the first plate, the second plate and at least a part of the excitation component are configured to form a tank circuit, thereby enabling the antenna structure to radiate at a predefined radiation frequency comprising a resonant frequency associated with the tank circuit.

24 Claims, 9 Drawing Sheets

(51) Int. Cl.
*H01Q 1/22* (2006.01)
*H01Q 1/48* (2006.01)
*H01Q 1/27* (2006.01)

(58) Field of Classification Search
USPC .......................................................... 343/846
See application file for complete search history.

(56) References Cited

U.S. PATENT DOCUMENTS

| | | | | |
|---|---|---|---|---|
| 8,421,689 | B2 | 4/2013 | Schlub et al. | |
| 2002/0080078 | A1 | 6/2002 | Trumbell et al. | |
| 2002/0126047 | A1 | 9/2002 | Laureanti | |
| 2003/0206136 | A1 | 11/2003 | Chen | |
| 2006/0214857 | A1 * | 9/2006 | Ollikainen | H01Q 9/30 343/702 |
| 2009/0233657 | A1 * | 9/2009 | Ogawa | H01Q 9/16 455/575.3 |
| 2010/0056234 | A1 * | 3/2010 | Yamamoto | H01Q 9/28 455/575.7 |
| 2014/0210674 | A1 | 7/2014 | Yonei et al. | |
| 2014/0354494 | A1 | 12/2014 | Katz | |
| 2016/0006110 | A1 | 1/2016 | Sidharath et al. | |
| 2016/0294038 | A1 | 10/2016 | Lo et al. | |
| 2017/0358850 | A1 | 12/2017 | Vanjani | |
| 2018/0309194 | A1 | 10/2018 | Wang et al. | |

FOREIGN PATENT DOCUMENTS

| | | | |
|---|---|---|---|
| CN | 206180087 | U | 5/2017 |
| CN | 206196049 | U | 5/2017 |
| JP | H10107671 | A | 4/1998 |
| WO | 2014/151558 | A1 | 9/2014 |
| WO | 2016/061154 | A1 | 4/2016 |

OTHER PUBLICATIONS

International Preliminary Report on Patentability dated Jul. 14, 2020 for International Application No. PCT/US2018/013072.
"Notification to Grant Patent Right for Chinese Patent Application No. 201880086091.1", dated Jan. 30, 2022, 9 Pages.

* cited by examiner

FOLDED PLANAR ANTENNA

This application is a National Phase entry application of International Patent Application No. PCT/US2018/013072 filed on Jan. 10, 2018 and is hereby incorporated by reference in its entirety.

FIELD

The present disclosure relates to the field of wireless communication devices, and in particular to a method and an apparatus for an antenna structure associated with wireless communication devices.

BACKGROUND

Antenna design is critical in a wireless communication device that transmits and receives electromagnetic radiation in free space. Antennas are often bulky and consumes considerable space in many portable wireless communication devices such as mobile phones. Whilst the demand for ever smaller and more powerful wireless communication devices increases, as does the importance of designing and engineering smaller antennas to fit these devices. However, designing very small antennas sometimes greatly affect the efficiency of antennas and also make the antenna design very complicated. Further, in the case of wearable devices such as smart watches and apparels, due to a close proximity of human body, energy associated with the electromagnetic radiation of the antennas is degraded as the electromagnetic radiation penetrates and deflects off the human body, resulting in a considerable reduction in efficiency of antennas.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
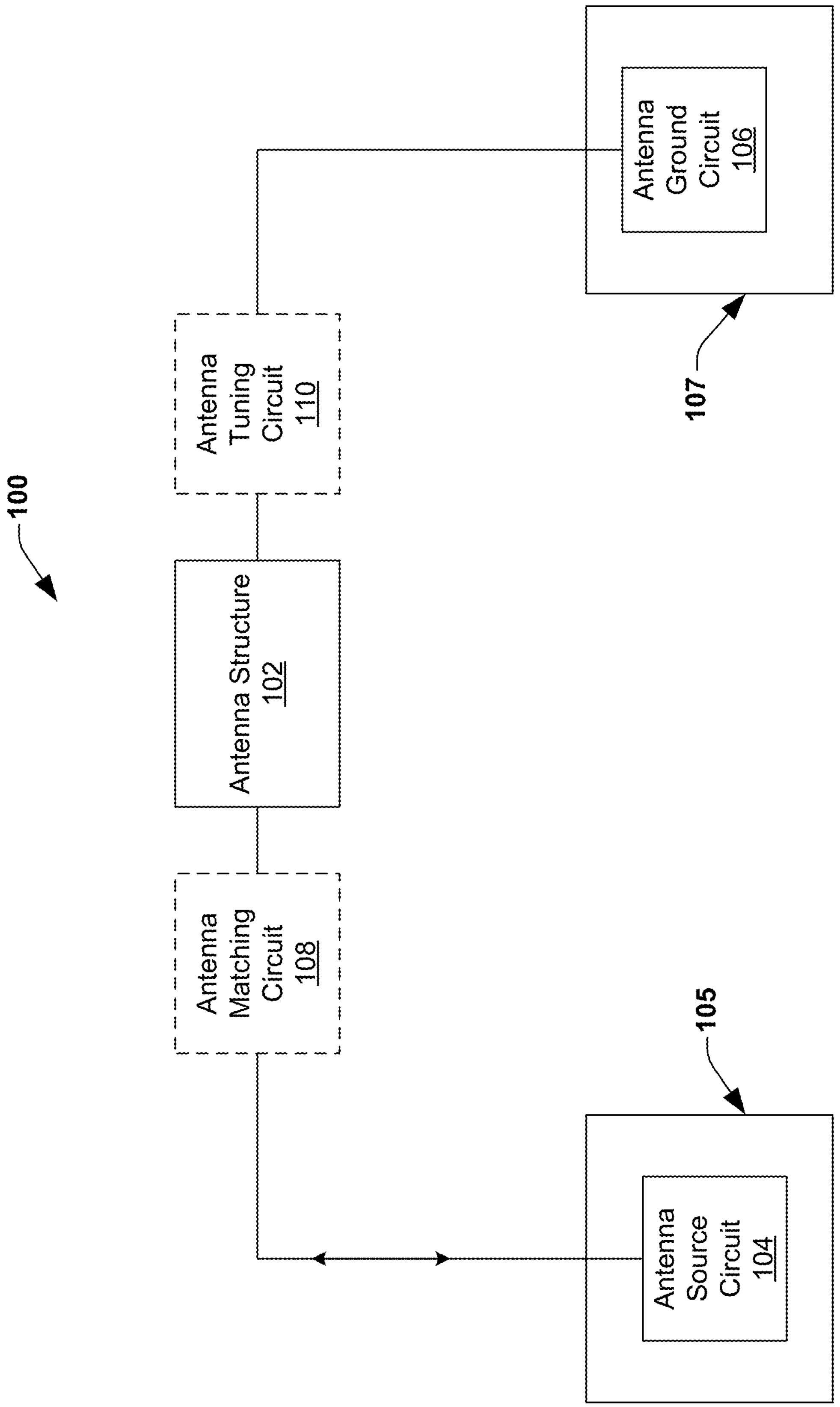
FIG. 1 illustrates an exemplary simplified block diagram of a wireless communication device comprising an antenna structure, according to one embodiment of the disclosure.

In one embodiment of the disclosure, a wireless communication device comprised of a plurality of structures configured to enable structural, functional or cosmetic functions associated with the device is disclosed. The wireless communication device comprises an antenna structure configured to radiate at a predefined radiation frequency. In some embodiments, the antenna structure comprises a first plate comprised of a first set of structures of the plurality of structures of the device; and a second, different, plate comprised of a second set of structures of the plurality of structures of the device. In some embodiments, the first plate and the second plate are spaced apart from one another, and wherein the first plate and the second plate overlap, at least partially.

In one embodiment of the disclosure, an antenna structure associated with a wireless communication device comprised of a plurality of structures configured to enable structural, functional or cosmetic functions associated with the device is disclosed. The antenna structure comprises a first plate comprised of a first set of structures of the plurality of structures of the device and a second, different, plate comprised of a second set of structures of the plurality of structures of the device. In some embodiments, the first plate and the second plate are spaced apart from one another, and the first plate and the second plate overlap. In some embodiments, the antenna structure further comprises an excitation component coupled between the first plate and the second plate. In some embodiments, the first plate, the second plate and at least a part of the excitation component are configured to form a tank circuit, in order to enable the antenna structure to radiate at a predefined radiation frequency comprising a resonant frequency associated with the tank circuit.

In one embodiment of the disclosure, an antenna structure associated with a wireless communication device is disclosed. The antenna structure comprises a first plate having an at least partially planar structure, a second, different, plate having an at least partially planar structure, and an excitation component coupled between the first plate and the second plate. In some embodiments, the first plate and the second plate are spaced apart from one another, and the first plate and the second plate overlap, at least partially. Further, in some embodiments, the first plate, the second plate and at least a part of the excitation component are configured to form a tank circuit, in order to enable the antenna structure to radiate at a predefined radiation frequency comprising a resonant frequency associated with the tank circuit.

In one embodiment of the disclosure, a method for a wireless communication device comprised of a plurality of structures configured to enable structural, functional or cosmetic functions associated with the device is disclosed. The method comprises forming an antenna structure comprising a first plate comprised of a first set of structures of the plurality of structures of the device, a second, different, plate comprised of a second set of structures of the plurality of structures of the device, and an excitation component comprising a first metallic pin and a second, different metallic pin coupled between the first plate and the second plate. The method further comprises configuring the first plate, the second plate and at least a part of the excitation component to form a tank circuit, in order to enable the antenna structure to radiate at a predefined radiation frequency comprising a resonant frequency associated with the tank circuit.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "circuit" and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the event that the terms "including", "includes", "having", "has", "with", or variants thereof are used in either the detailed description and the claims, such terms are intended to be inclusive in a manner similar to the term "comprising." In addition, the term "coupled" should generally be construed to mean "operably coupled" unless specified otherwise or clear from context to be directed to a "direct connection".

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

As indicated above, antenna design is critical in wireless communication devices. The antenna of a transmitter emits high frequency energy (or radio waves) into space while the antenna of a receiver receives high frequency radio waves from space and converts it into electricity. If the antenna is not precisely the right length for the frequency used, the radio waves cannot be emitted or captured efficiently. With the increasing demand for smaller and more powerful devices, there is an increased demand to design smaller and more powerful antennas. However, designing very small antennas greatly affect the efficiency of antennas and also make the antenna design very complicated. Further, in the case of wearable devices, for example, smart watch, due to a close proximity of human body, energy associated with the electromagnetic radiation of the antennas is absorbed by the human body resulting in a considerable reduction in efficiency of antennas.

In order to overcome the above difficulties, an apparatus and a method for an antenna structure in a wireless communication device is proposed in this disclosure. In particular, the antenna structure proposed herein comprises one or more structures associated with a wireless communication device, wherein the one or more structures are configured to radiate at a predefined radiation frequency. In some embodiments, the one or more structures forming the antenna structure comprises structures that are positioned away from human body, so as to reduce the absorption of energy by the human body. In some embodiments, utilizing the one or more structures associated with the wireless communication device to form the antenna structure, enables to design antennas suitable for very small devices, with reduced or minimal impact on antenna efficiency.

FIG. 1 illustrates an exemplary simplified block diagram of a wireless communication device 100, according to one embodiment of the disclosure. In some embodiments, the wireless communication device 100 comprise a portable communication device such as a smart phone, a tablet etc. or a wearable device such as a smart watch or a smart apparel. However, other wireless communication devices different from above are also contemplated to be within the scope of this disclosure. The wireless communication device 100 comprises an antenna structure 102, source circuit 105 and a ground circuit 107. In some embodiments, the antenna structure 102 can comprise one or more mechanical structures associated therewith. In some embodiments, the source circuit 105 comprises one or more circuitry (e.g., RF circuitry, application circuitry, memory etc.) associated with the wireless communication device 100. In some embodiments, the ground circuit 107 comprises a circuitry or a ground wire that provides a ground potential to the one or more circuitry associated with the source circuit 105. In some embodiments, the ground circuit 107 provide a return path for the signals associated with the source circuit 105.

In some embodiments, the source circuit 105 comprises an antenna source circuit 104 comprising one or more circuitry associated with or coupled to the antenna structure 102 that process or generate signals associated with the antenna structure 102. In some embodiments, the antenna source circuit 104 comprises a transceiver circuitry (e.g., radio frequency (RF) circuitry, baseband (BB) circuitry etc., but not limited to) associated with the antenna structure 102. In the embodiments described herein, the antenna source circuit 104 is assumed to include one or more circuits associated with the transceiver circuitry of the wireless communication device 100, and is not to be construed to just a source impedance associated with an antenna source circuit 104. In some embodiments, the antenna source circuit 104 is configured to process signals received at the antenna structure 102 during a receive mode of operation of the wireless communication device 100 or generate signals to be provided to the antenna structure 102 for transmission during a transmit mode of operation of the wireless communication device 100. In some embodiments, the antenna source circuit 104 comprises a receiver circuitry or transmitter circuitry or both. In some embodiments, the ground circuit 107 comprises an antenna ground circuit 106 comprising a ground wire that serves as a return path for signals associated with the antenna structure 102. In some embodiments, a ground wire associated with the antenna source circuit 104 further acts as the antenna ground circuit 106.

In some embodiments, the wireless communication device 100 further comprises an antenna matching circuit 108 and an antenna tuning circuit 110. In some embodiments, the wireless communication device 100 can comprise one or more additional components than depicted in FIG. 1, but are not depicted herein as those components are not within the scope of this disclosure. The antenna structure 102 is configured to receive a transmit signal from the antenna source circuit 104 and convert the transmit signal into radio waves at a predefined radiation frequency, during a transmit mode of operation of the wireless communication device 100. Further, the antenna structure 102 is configured to receive radio waves at a predefined radiation frequency from space and convert the radio waves into electric signals comprising a received signal to be provided to the antenna source circuit 104, during a receive mode of operation of the wireless communication device 100.

In some embodiments, the antenna structure 102 is configured to form a tank circuit that has a resonant frequency comprising the predefined radiation frequency, in order to enable the antenna structure 102 to radiate signals at the predefined radiation frequency or receive signals at the predefined radiation frequency. In some embodiments, a tank circuit comprises a parallel inductor (L)/capacitor (C) circuit configured to resonate at a resonant frequency associated therewith. In some embodiments, the formation of the tank circuit enables to negate the effect of a capacitance formed within the antenna structure, thereby avoiding energy associated with the antenna structure 102 from getting stored within the capacitance. In some embodiments, formation of the tank circuit enables the antenna structure 102 to direct the energy associated with the antenna structure 102, to one or more components of the antenna structure 102, in order for the energy to be radiated more effectively, further details of which are given in an embodiment below.

In some embodiments, the resonant frequency associated with a tank circuit is defined by the inductance and capacitance associated with the tank circuit and is given by the equation below:

$$f = \frac{1}{2\pi\sqrt{LC}} \tag{1}$$

Where f is the resonant frequency or the predefined radiation frequency of the antenna structure 102, L is the inductance associated with the antenna structure 102 and C is the capacitance associated with the antenna structure 102.

In some embodiments, the antenna matching circuit 108 is coupled between the antenna structure 102 and the antenna source circuit 104, in order to match an impedance of the antenna source circuit 104 to the antenna structure 102, thereby reducing a mismatch loss between the antenna source circuit 104 and the antenna structure 102. Further, in some embodiments, the antenna tuning circuit 110 is coupled between the antenna structure 102 and the antenna ground circuit 106, in order to tune the resonant frequency associated with the antenna structure 102. In some embodiments, the antenna structure 102 may comprise a first plate, a second plate, and an excitation component coupled between the first plate and the second plate, details of which are given in an embodiment below. In some embodiments, the first plate, the second plate and at least a part of the excitation component are configured to form the tank circuit having a resonant frequency associated therewith, in order to enable the antenna structure to radiate at the resonant frequency comprising the predefined radiation frequency, as indicated above. In particular, in some embodiments, the first plate and the second plate may be configured to form a capacitive element of the tank circuit and at least a part of the excitation component may be configured to form an inductive component of the tank circuit, the details of which are given in an embodiment below.

In some embodiments, wireless communication devices, for example, smart phones, smart watches etc. may comprise a plurality of structures configured to enable structural, functional or cosmetic functions associated with the device. In order to reduce the complexity associated with antenna design in smaller wireless communication devices, in some embodiments, one or more structures associated with the wireless device may be utilized to form the antenna structure 102. Therefore, in some embodiments, the first plate and the second plate may be comprised of one or more structures of the plurality of structures of the wireless communication device, detailed explanation of which is given in an embodiment below. In some embodiments, for example, in the case of wearable devices like smart watch, the antenna structure 102 is configured to be as far as possible from the human body, so as to reduce the energy absorption by the human body, thereby enabling the antenna structure 102 to operate at higher efficiency. Therefore, in such embodiments, one or more structures of the device that may be positioned farthest from the human body, for example, an outer conductive frame of the wireless communication device 100, may be chosen to form the first plate or the second plate of the antenna structure 102. However, in other embodiments, the first plate or the second plate, or both of the antenna structure 102 can be comprised of dedicated structures that are different from the one or more structures of the plurality of structures of the wireless communication device.

Figure 2B:
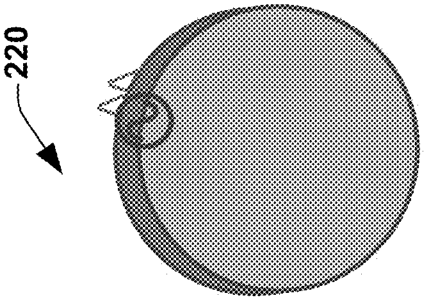
FIG. 2*b* illustrates an example implementation of an antenna structure, according to yet another embodiment of this disclosure.
Figure 2A:
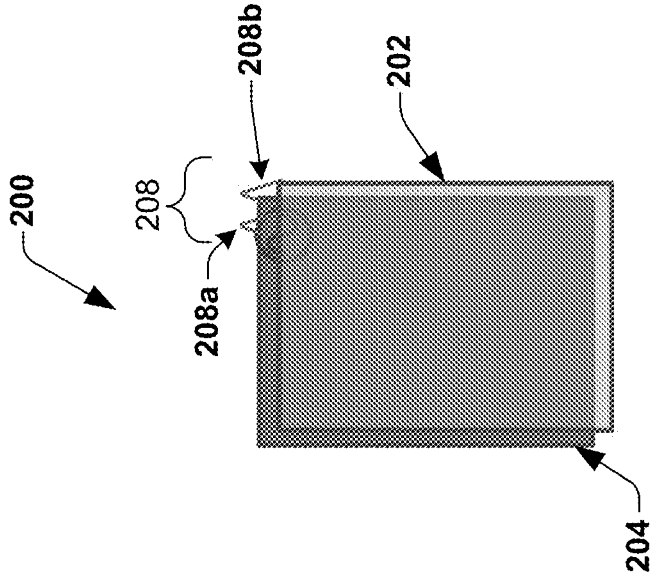
FIG. 2*a* illustrates an example implementation of an antenna structure, according to one embodiment of this disclosure.

FIG. 2*a* illustrates an example implementation of an antenna structure 200, according to one embodiment of this disclosure. In some embodiments, the antenna structure 200 depicts one exemplary way of implementation of the antenna structure 102 in FIG. 1. In some embodiments, the antenna structure 200 may be included within the antenna structure 102 in FIG. 1 and is therefore, explained herein with reference to the wireless communication device 100 in FIG. 1. In some embodiments, the antenna structure 200 comprises a first plate 202, a second plate 204 and an excitation component 208. In some embodiments, the excitation component 208 comprises a first metallic pin 208*a* and a second metallic pin 208*b* coupled between the first plate 202 and the second plate 204.

In some embodiments, the first plate 202, the second plate 204 and at least a part of the excitation component 208 are configured to form a tank circuit having a resonant frequency associated therewith, thereby enabling the antenna structure 200 to radiate at a predefined radiation frequency comprising the resonant frequency. In some embodiments, the first plate 202 and the second plate 204 form a capacitive element associated with the tank circuit, and at least a part of the excitation component 208 form an inductive component associated with the tank circuit. In some embodiments, for example, in applications where one or more structures of a device is utilized to form the antenna structure (e.g., the antenna structure 102 in FIG. 1), the formation of the capacitance comprised of the first plate 202 and the second plate 204 is necessitated due to design restrictions and is not an antenna design requirement. In some embodiments, the tank circuit is formed in order to negate the effect of the capacitance formed within the antenna structure 200. In some embodiments, the formation of the tank circuit enables to radiate energy injected into the antenna structure 200 from an antenna source circuit (e.g., the antenna source circuit 104 in FIG. 1) and prevent the energy from being stored in the capacitor (e.g., the capacitance formed from the first plate 202 and the second plate 204). In some embodiments, the formation of the tank circuit further enables to restrict the flow of energy to one of the plates of the antenna structure, for example, the first plate 202, thereby enabling more effective radiation of energy. In some embodiments, the resonant frequency associated with the tank circuit is defined by the capacitance contributed by the first plate 202 and the second plate 204, and the inductance contributed by the excitation component 208, in accordance with the equation (1) above.

In some embodiments, the first plate 202 and the second plate 204 comprises one or more structures of a plurality of structures associated with a wireless communication device (e.g., the wireless communication device 100 in FIG. 1), as indicated above with respect to FIG. 1. In particular, in some embodiments, the first plate 202 may be comprised of a first set of structures of the plurality of structures of the wireless communication device, and the second plate 204 may be comprised of a second set of structures of the plurality of devices of the wireless communication device. However, in other embodiments, the first plate 202 or the second plate 204, or both can have dedicated structures, different from the structures associated with the wireless communication device. In some embodiments, the first plate 202 and the second plate 204 may comprise at least partially planar structures. In the embodiments described herein, the term "at least partially planar structure" is used to refer to structures having at least a part that is planar. However, in other embodiments, the first plate 202 and the second plate 204 may have a completely planar structure. In some embodiments, the first plate 202 and the second plate 204 comprises structures that are spaced apart from one another and are configured to overlap, at least partially, as can be seen in FIG. 2*a*. In some embodiments, the first plate 202 and the second plate 204 can assume different shapes, for example, rectangular as shown in FIG. 2*a* and circular as in FIG. 2*b*. However, other possible shapes of the first plate 202 and the second plate 204 are also contemplated to be within the scope of this disclosure, for example, hexagonal, oval etc. Further, in other embodiments, the first plate 202 and the second plate 204 may not have a designated shape, and usually takes the shape of structures associated with the wireless communication device.

In some embodiments, one of the plates of the first plate 202 and the second plate 204 may be coupled to an antenna ground circuit (e.g., the antenna ground circuit 106 in FIG. 1), in order to enable the first plate 202 and the second plate 204 to form the capacitive element associated with the tank circuit. In this example embodiment, the second plate 204 is configured to be coupled to the antenna ground circuit. Alternately, in other embodiments, the first plate 202 may be configured to be coupled to the antenna ground circuit. In some embodiments, the second plate 204 is further configured to be coupled to an antenna source circuit (e.g., the antenna source circuit 104 in FIG. 1). In some embodiments, the excitation component 208 comprises a first metallic pin 208*a* and a second metallic pin 208*b* coupled between the first plate 202 and the second plate 204. In some embodiments, the first metallic pin 208*a* is configured to couple to the antenna source circuit (e.g., the antenna source circuit 104 in FIG. 1), thereby forming a source leg associated with the antenna structure 102. In some embodiments, the source leg enables to convey signals between the antenna structure 102 and the antenna source circuit 104.

Further, in some embodiments, the second metallic pin 208*b* may be configured to couple to the antenna ground circuit 106, thereby forming a ground leg associated with the antenna structure 102. In some embodiments, the ground leg forms a return path for the signals associated with the antenna source circuit 104. In some embodiments, the ground leg comprises an inductive element associated with the tank circuit. In some embodiments, the first metallic pin 208*a* also contributes to an inductance of the inductive element of the tank circuit. In some embodiments, the first metallic pin 208*a* and the second metallic pin 208*b* are positioned next to one another, and are positioned along a perimeter of the first plate 202 and the second plate 204. However, in other embodiments, the first metallic pin 208*a* and the second metallic pin 208*b* may be located at different locations, for example, can be located farther apart from one another. In some embodiments, the relative position of the first metallic pin 208*a* with respect to the second metallic pin 208*b* dictates the inductance contributed by the first metallic pin 208*a* and the second metallic pin 208*b*. Therefore, in some embodiments, varying the relative positions of the first metallic pin 208*a* and the second metallic pin 208*b* with respect to one another, enables to tune the resonant frequency of the tank circuit.

In some embodiments, the second plate 204 comprises at least one structure that is coupled to the antenna ground circuit (e.g., the antenna ground circuit 106 in FIG. 1) and the antenna source circuit (e.g., the antenna source circuit 108 in FIG. 1). For example, in some embodiments, the second plate 204 may comprise, at least partially, a printed circuit board (PCB) comprising the antenna ground circuit and the antenna source circuit. Therefore, in such embodiments, the antenna source circuit 104 and the antenna ground circuit 106 in FIG. 1 above can be part of the antenna structure 102 (e.g., a part of the second plate associated with the antenna structure). In such embodiments, the first metallic pin 208*a* and the second metallic pin 208*b* may be coupled to the first plate 202 at one end and to the PCB at the other end, in order to couple to the antenna source circuit and the antenna ground circuit, respectively associated with the PCB. Alternately, in some embodiments, the second plate may comprise, at least partially, an alternate structure, different from the PCB that is coupled to the antenna source circuit and the antenna ground circuit associated with the device. In such embodiments, the first metallic pin 208*a* and the second metallic pin 208*b* may be coupled to the first plate 202 at one end and to the alternate structure at the other end, in order to couple to the antenna source circuit and the antenna ground circuit, respectively associated with the PCB. In some embodiments, the alternate structure is utilized as an extension of the PCB, when there are some limitations to adding new connections to the PCB.

In some embodiments, an antenna matching circuit (e.g., the antenna matching circuit 108 in FIG. 1) is coupled operably between the first metallic pin 208*a* (i.e., the source leg) and the antenna source circuit associated with the second plate 204, in order to match an impedance between the antenna source circuit and the antenna structure 200, thereby reducing a mismatch loss between the antenna source circuit and the antenna structure 200, the details of which are given in an embodiment below. Further, in some embodiments, an antenna tuning circuit (e.g., the antenna tuning circuit 110 in FIG. 1) is coupled between the second metallic pin 208*b* (i.e., the ground leg) and the antenna ground circuit (e.g., the antenna ground circuit 106 in FIG. 1), in order to tune the resonant frequency associated with the antenna structure 200. In some embodiments, the antenna tuning circuit is configured to modify the impedance of the ground leg, in order to tune the resonant frequency of the tank circuit.

Figure 3:
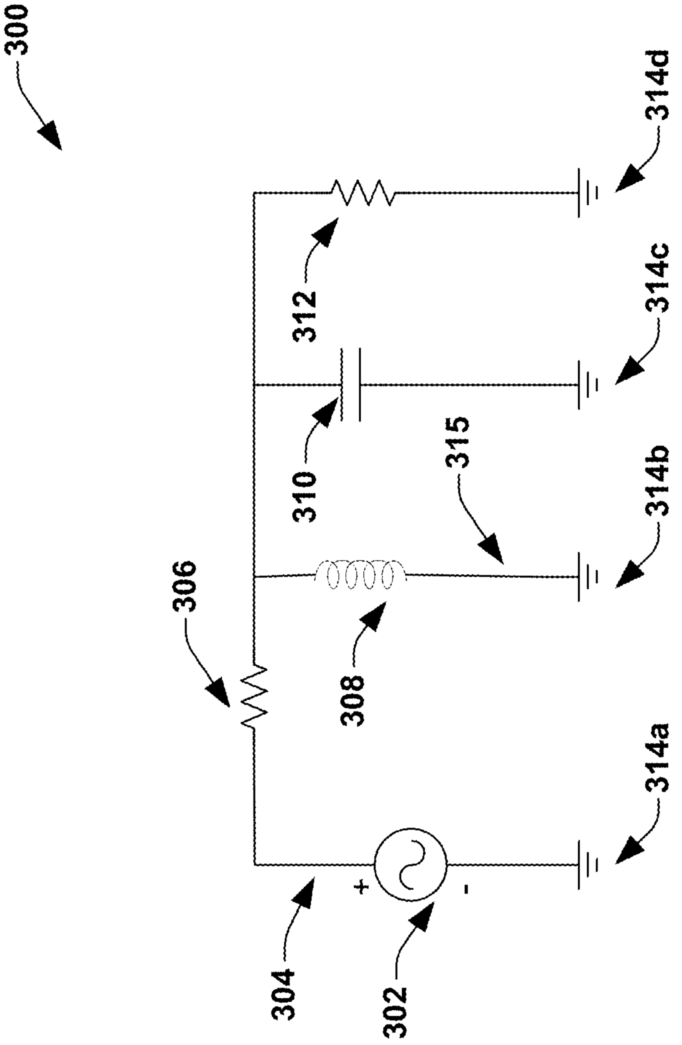
FIG. 3 illustrates an equivalent circuit diagram of an antenna structure associated with a wireless communication device, according to one embodiment of the disclosure.

In some embodiments, the capacitive element comprising the first plate 202 and the second plate 204, and the inductive element comprising the second metallic pin 204 are parallel to one another, thereby forming the parallel LC tank circuit, as can be seen in the equivalent circuit diagram 300 in FIG. 3. In some embodiments, a resonant frequency of the parallel LC tank circuit is given by the equation (1) above. In some embodiments, the equivalent circuit diagram 300 comprises an equivalent circuit diagram of an antenna structure and is explained herein with reference to the antenna structure 200 in FIG. 2 and the wireless communication device 100 in FIG. 1. Referring to FIG. 3, the capacitor 310 comprises the capacitance contributed by the first plate 202 and the second plate 204 in FIG. 2*a*. Further, the path 315 depicts the ground leg (e.g., the second metallic pin 208*b* in FIG. 2) coupled to the ground circuit 314*b* (e.g., the antenna ground circuit 106 in FIG. 1) and the inductor 308 depicts the inductance contributed by the ground leg in FIG. 2*a*. Furthermore, the path 304 depicts the source leg (e.g., the first metallic pin 208*a* in FIG. 2*a*) coupled to the source circuit 302 (e.g., the antenna source circuit 104 in FIG. 1). The capacitor 310 and the inductor 308 form a parallel LC circuit having a resonant frequency f given by the equation (1) above. In some embodiments, the resistor 306 depicts the resistive losses of the antenna structure and the resistor 312 depicts the dielectric losses of the antenna structure.

Figure 4A:
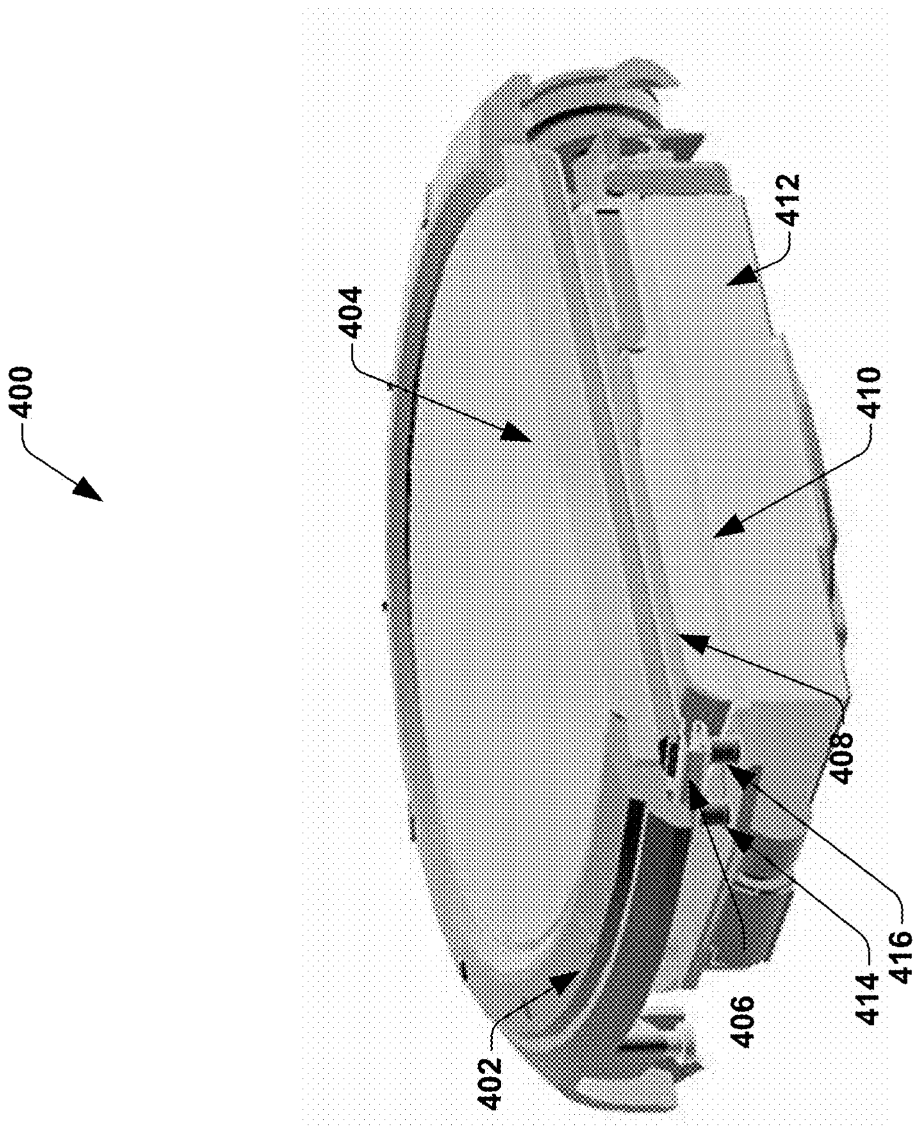
FIG. 4*a* illustrates an example implementation of a wireless communication device comprising an antenna structure, according to one embodiment of the disclosure.

FIG. 4*a* illustrates an example implementation of a wireless communication device 400 comprising an antenna structure, according to one embodiment of the disclosure. In this embodiment, the wireless communication device 400 comprises a smart watch. However, in other embodiments, the wireless communication device can comprise other devices, for example, a smart phone, a tablet computer, a smart apparel etc. The wireless communication device 400 has features similar to the wireless communication device 100 in FIG. 1. In some embodiments, the antenna structure included within the wireless communication device 400 is similar to the antenna structure 102 explained in FIG. 1. Therefore, the antenna structure in the wireless communication device 400 is explained herein with reference to the wireless communication device 100 in FIG. 1 and the antenna structure 200 in FIG. 2*a* or FIG. 2*b*. The smart watch 400 is comprised of a plurality of structures configured to enable structural, functional or cosmetic functions associated with the watch. For example, in this example embodiment, the smart watch 400 comprises a top bezel 402 comprising an outer conductive structure or frame of the watch, glass cover 404, an upper protective shield 406 coupled to the top bezel, a printed circuit board (PCB) 410 comprising one or more circuitry associated with the watch, a PCB shield 408 configured to protect the circuitry associated with the PCB 410 and a battery 412. However, in other embodiments, the smart watch 400 can comprise more or less than the above components.

In some embodiments, one or more structures of the plurality of structures of the smart watch 400 are utilized to form an antenna structure (e.g., the antenna structure 102 in FIG. 1). In some embodiments, the one or more structures of the smart watch 400 that forms the antenna structure are configured to radiate at a predefined radiation frequency based on forming a tank circuit that resonates at a resonant frequency comprising the predefined radiation frequency. For example, in this embodiment, the top bezel 402 and the upper protective shield 406 are configured to form a first plate (e.g., the first plate 202 in FIG. 2*a*) of the antenna structure. In some embodiments, the top bezel 402 and the upper protective shield 406 of the smart watch 400 are integrated together to act as a single integrated structure. Further, the PCB 410 and the PCB shield 408 are configured to form a second plate (e.g., the second plate 204 in FIG. 2*a*) of the antenna structure. In addition, 2 metallic pins (e.g., pogo pins) are coupled between the first plate and the second plate to form an excitation component (e.g., the excitation component 208 in FIG. 2*a*). In particular, a first metallic pin 414 is coupled between the first plate and the second plate, and a second metallic pin 416 is coupled between the first plate and the second plate, in order to form the excitation component of the antenna structure.

In some embodiments, the first metallic pin 414 is configured to be coupled to an antenna source circuit (e.g., the antenna source circuit in FIG. 2*a*), thereby forming a source leg (e.g., the source leg 208*a* in FIG. 2*a*) associated with the antenna structure. Further, the second metallic pin 416 is configured to be coupled to an antenna ground circuit (e.g., the antenna ground circuit 106 in FIG. 1), thereby forming a ground leg (e.g., the ground leg 208*b* in FIG. 2*a*) associated with the antenna structure. In some embodiments, the antenna source circuit (not shown) and the antenna ground circuit (not shown) is embedded within or included as part of the PCB 410. In some embodiments, the antenna source circuit comprises a transceiver circuitry (e.g., radio frequency (RF) circuitry, baseband (BB) circuitry etc.) configured to process signals received at the antenna structure during a receive mode or generate signals to be provided to the antenna structure for transmission during a transmit mode. In some embodiments, the antenna ground circuit comprises a ground wire that serves as a return path for the antenna signals. In some embodiments, a ground wire associated with the antenna source circuit further acts as the antenna ground circuit.

In this embodiment, the first metallic pin 414 is coupled to the upper protective shield 406 (comprising the first plate of the antenna structure) at a first end and the PCB 410 (comprising the second plate) at a second, different, end. Further, the first metallic pin 414 is coupled to the antenna source circuit associated with the PCB 410 at the second end. However, in other embodiments, the first metallic pin 414 may be coupled to any of the structures forming the first plate at the first end and is not limited to the upper protective shield 406 above. Similarly, in other embodiments, the first metallic pin 414 may be coupled to any of the structures forming the second plate at the second end, provided that the said structure forming the second plate is coupled to the antenna source circuit.

Figure 4B:
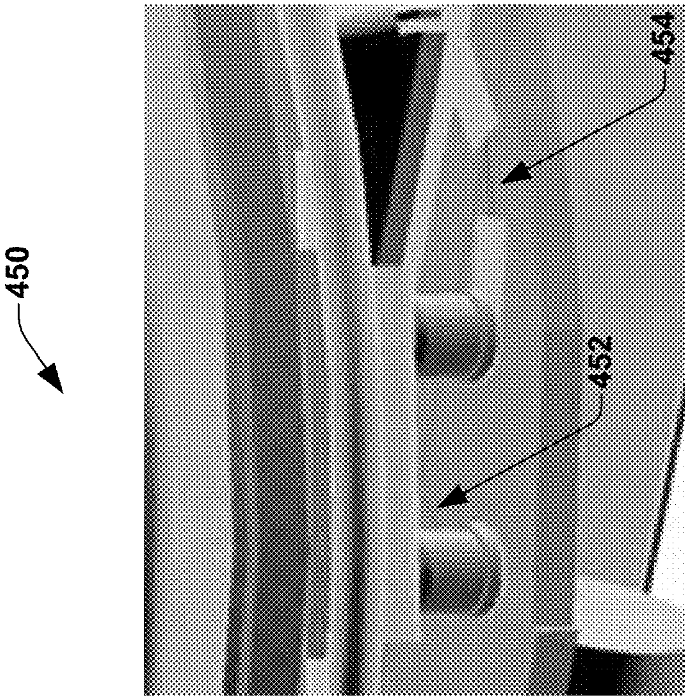
FIG. 4*b* illustrates an enlarged diagram of the antenna structure of FIG. 4*a*, according to one embodiment of the disclosure.

In this example embodiment, the first metallic pin 414 is coupled to a non-conductive surface of the PCB 410 (along the periphery of the PCB 410) at the second end and coupled to the antenna source circuit via a conductive trace coupled between the second end of the first metallic pin 414 and the antenna source circuit. In some embodiments, first metallic pin 414 is coupled to the antenna source circuit via a conductive trace 452 as shown in the antenna structure 450 in FIG. 4*b*. In some embodiments, FIG. 4*b* comprises an enlarged diagram of the antenna structure of FIG. 4*a*. In some embodiments, coupling the first metallic pin 414 to the non-conductive surface of the PCB 410 along its periphery provides flexibility in positioning the first metallic pin 414 anywhere along the periphery of the PCB 410, in order to form the antenna structure. However, in other embodiments, the first metallic pin 414 may be coupled directly to the antenna source circuit on the PCB 410 and in such embodiments, the conductive trace 452 as shown in FIG. 4*b* may be avoided. Further, in some embodiments, the first metallic pin 414 may be coupled to an alternate structure different from the PCB 410 that is coupled to the antenna source circuit, at the second end.

Similarly, in this embodiment, the second metallic pin 416 is coupled to the upper protective shield 406 (comprising the first plate of the antenna structure) at a first end and the PCB 410 (comprising the second plate) at a second, different, end. Further, the second metallic pin 416 is coupled to the antenna ground circuit associated with the PCB 410 at the second end. However, in other embodiments, the second metallic pin 416 may be coupled to any of the structures forming the first plate at the first end and is not limited to the upper protective shield 406 above. Similarly, in other embodiments, the second metallic pin 416 may be coupled to any of the structures forming the second plate at the second end, provided that the said structure forming the second plate is coupled to the antenna ground circuit.

In this example embodiment, the second metallic pin 416 is coupled to a non-conductive surface of the PCB 410 (along the periphery of the PCB 410) at the second end and coupled to the antenna ground circuit via a conductive trace coupled between the second end of the second metallic pin 416 and the antenna ground circuit. In some embodiments, second metallic pin 416 is coupled to the antenna ground circuit via a conductive trace 454 as shown in the antenna structure 450 in FIG. 4*b*. In some embodiments, FIG. 4*b* comprises an enlarged diagram of the antenna structure of FIG. 4*a*. In some embodiments, coupling the second metallic pin 416 to the non-conductive surface of the PCB 410 along its periphery provides flexibility in positioning the second metallic pin 416 anywhere along the periphery of the PCB 410, in order to form the antenna structure. However, in other embodiments, the second metallic pin 416 may be coupled directly to the antenna ground circuit on the PCB 410 and in such embodiments, the conductive trace 454 as shown in FIG. 4*b* may be avoided. Further, in some embodiments, the second metallic pin 416 may be coupled to an alternate structure different from the PCB 410 that is coupled to the antenna ground circuit, at the second end.

In this embodiment, the first metallic pin 414 and the second metallic pin 416 are positioned next to one another, however, in other embodiments, the first metallic pin 414 and the second metallic pin 416 may be positioned farther away from one another. In some embodiments, the first plate (i.e., the top bezel 402 and the upper protective shield 406), the second plate (i.e., the PCB 410 and the PCB shield PCB shield 408) and at least a part of the excitation component (e.g., the second metallic pin 416) forms a tank circuit configured to radiate at a predefined radiation frequency comprising a resonant frequency associated with the tank circuit. In some embodiments, the first plate and the second plate form a capacitor. In some embodiments, the tank circuit is formed in order to avoid energy injected to the antenna structure from the antenna source circuit from being stored in the capacitor (formed from the two plates) and redirect the energy to the first plate (e.g., the top bezel 402) to radiate. In some embodiments, a part of the excitation component, that is, the second metallic pin 416 in association with the first plate and the second plate, is configured to form the tank circuit. In particular, in some embodiments, the first plate and the second plate together form a capacitive element associated with the tank circuit, and the second metallic pin 416 (i.e., the ground leg) forms an inductive element associated with the tank circuit. In some embodiments, a capacitance between the first plate and the second plate of the smart watch 400, and an inductance of the ground leg 416 of the smart watch 400 defines the predefined radiation frequency of the antenna structure associated with the smart watch 400. In some embodiments, the predefined radiation frequency comprises a global positioning system (GPS) frequency. However, in other embodiments, the predefined frequency can comprise other frequencies different from the GPS frequency, for example, BeiDou, GLONASS etc. or a frequency range covering multiple frequency bands like GPS, BeiDou, GLONASS etc (e.g., 1.56 GHz-1.61 GHz). Further, in some embodiments, the predefined frequency can comprise lower frequency bands, for example, cellular frequency bands. In some embodiments, the source leg 414 and the ground leg 416 can be coupled between the first plate and second plate anywhere along the periphery of the first plate and the second plate.

In some embodiments, the resonant frequency associated with the tank circuit can further be tuned based on an antenna matching circuit (not shown) and an antenna tuning circuit (not shown), further details of which are given in an embodiment below. In some embodiments, the antenna matching circuit is coupled between the first metallic pin 414 and the antenna source circuit to match an impedance between the antenna source circuit and the antenna structure, in order to reduce a mismatch loss between the antenna source circuit and the antenna structure. Since the impedance of this antenna structure in large, in some embodiments, the antenna matching circuit comprises a small resistor coupled in series with the source leg 414. In some embodiments, the series resistor improves a fractional bandwidth of the antenna structure, reduces sensitivity to the tolerances of the matching component values of the antenna matching circuit and also improves the mismatch loss, for a small loss in signal strength. In some embodiments, the antenna matching circuit is coupled between the antenna source circuit and the first metallic pin 414 by coupling to or replacing the conductive trace 452 shown in FIG. 4*b*. Further, in some embodiments, the antenna tuning circuit is coupled between the second metallic pin 416 and the antenna ground circuit to modify the impedance of the ground leg 416, in order to tune the resonant frequency of the tank circuit. In some embodiments, the antenna tuning circuit comprises an additional capacitance or inductance coupled in series to the ground leg 416. In some embodiments, the antenna tuning circuit is coupled between the antenna ground circuit and the second metallic pin 416 by coupling to or replacing the conductive trace 454 shown in FIG. 4*b*.

Figure 5:
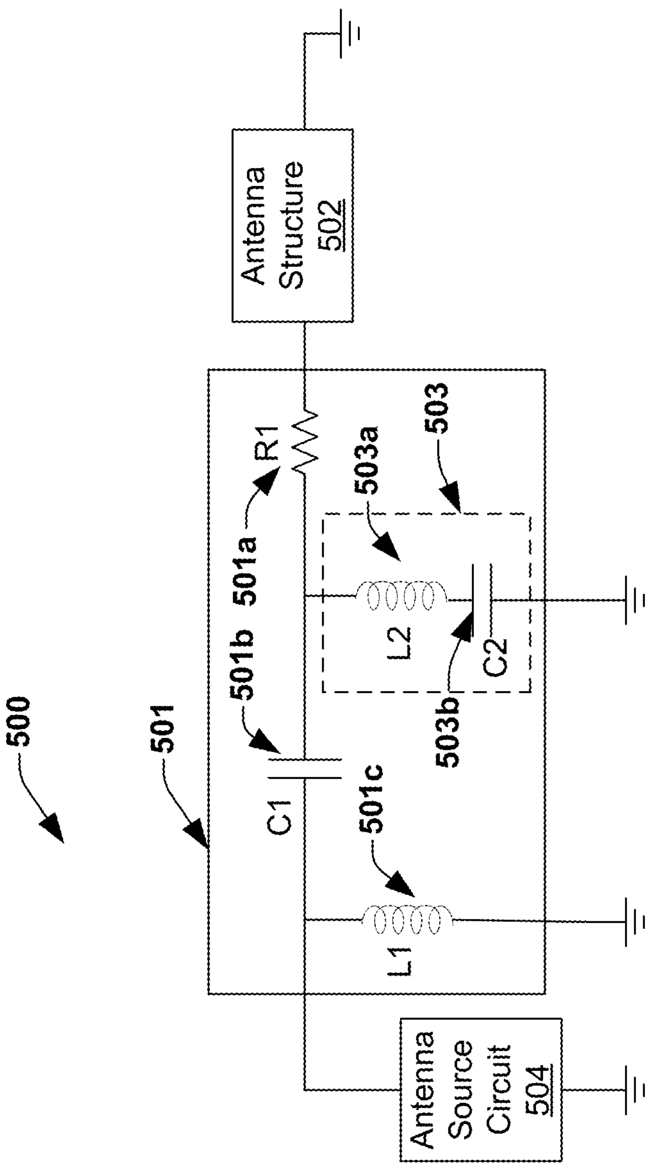
FIG. 5 illustrates an example implementation of an antenna matching circuit associated with a wireless communication device, according to one embodiment of the disclosure.

FIG. 5 illustrates an example implementation of an antenna matching circuit 501 associated with a wireless communication device 500, according to one embodiment of the disclosure. In the embodiment described herein, the antenna matching circuit 501 is illustrated as part of the wireless communication device 500 for clarity of explanation. In some embodiments, the wireless communication device 500 can be the same or similar as the wireless communication device 100 in FIG. 1. Further the antenna structure 502 and the antenna source circuit 504 in FIG. 5 are similar to the antenna structure 102 and the antenna source circuit 104 in FIG. 1, respectively. Further, the antenna structure 502 can have a structure similar to the antenna structure 200 in FIG. 2*a*. In some embodiments, the antenna matching circuit 501 depicts one possible way of implementation of the antenna matching circuit 108 in FIG. 1 and can be included within the antenna matching circuit 108 in FIG. 1. In some embodiments, the antenna matching circuit 501 is explained herein with reference to the wireless communication device 100 in FIG. 1 and the antenna structure 200 in FIG. 2*a*.

In some embodiments, the antenna matching circuit 501 is coupled between the antenna structure 502 and the antenna source circuit 504 to match an impedance between the antenna source circuit 504 and the antenna structure 502. In some embodiments, matching an impedance between the antenna source circuit 504 and the antenna structure 502 enables to reduce a mismatch loss between the antenna source circuit 504 and the antenna structure 502, thereby enabling to increase the power efficiency of the wireless communication device 500. In some embodiments, the antenna matching circuit 501 is coupled between a source leg (e.g., the source leg 208*a* in FIG. 2*a*) associated with the antenna structure 502 and the antenna source circuit 504, as explained above with respect to FIG. 2*a*. In this example embodiment, the antenna matching circuit 501 comprises a resistor R1 501*a*, a capacitor C1 501*b* and an inductor L1 501*c*. However, in other embodiments, the antenna matching circuit 501 may be implemented differently. In some embodiments, values of R1, C1 and L1 are chosen to match the impedance of the antenna source circuit 504 to the impedance of the antenna structure 502.

In some embodiments, the resistor R1 501*a* (typically having a small resistance value) is added in series to the antenna structure 502 (or to the source circuit associated therewith). In some embodiments, the series resistor R1 501*a* enables to improve a fractional bandwidth of the antenna structure 502. Further, in some embodiments, the series resistor R1 501*a* enables to reduce sensitivity to tolerances of the matching circuit component values (e.g., the capacitor C1 501*b*, the inductor L1 501*c* etc.). In some embodiments, the antenna matching circuit 501 further comprises a trap circuit 503 in parallel to the antenna structure 502. In some embodiments, the trap circuit 503 comprises an inductor L2 503*a* in series with a capacitor C2 503*b*. However, in other embodiments, the trap circuit 503 can be implemented differently. In some embodiments, the trap circuit 503 enables to reduce the interference from signals in undesired frequency ranges. For example, if the desired frequency is GPS frequency, then the undesired frequency ranges can comprise Wi-Fi, Bluetooth etc.

Figure 6A:
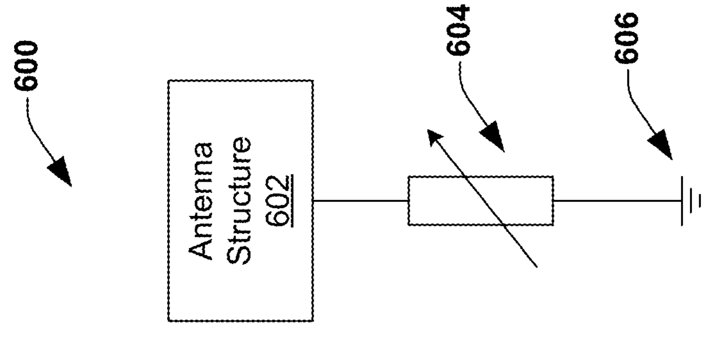
FIG. 6*a* illustrates a simplified block diagram of an antenna tuning circuit associated with a wireless communication device, according to one embodiment of the disclosure.

FIG. 6*a* illustrates a simplified block diagram of an antenna tuning circuit 604 associated with a wireless communication device 600, according to one embodiment of the disclosure. In the embodiment described herein, the antenna tuning circuit 604 is illustrated as part of the wireless communication device 600 for clarity of explanation. In some embodiments, the wireless communication device 600 can be the same or similar as the wireless communication device 100 in FIG. 1. Further, the antenna structure 602 and the antenna ground circuit 606 in FIG. 6*a* are similar to the antenna structure 102 and the antenna ground circuit 106 in FIG. 1, respectively. In addition, the antenna structure 602 can have a structure similar to the antenna structure 200 in FIG. 2*a*. In some embodiments, the antenna tuning circuit 604 can be included within the antenna tuning circuit 110 in FIG. 1. In some embodiments, the antenna tuning circuit 604 is explained herein with reference to the wireless communication device 100 in FIG. 1 and the antenna structure 200 in FIG. 2*a*.

In some embodiments, the antenna tuning circuit 604 is coupled between the antenna structure 602 and the antenna ground circuit 606 in order to tune a resonant frequency associated with the antenna structure 602. In some embodiments, tuning a resonant frequency of the antenna structure 602 enables to modify a predefined radiation frequency of the antenna structure 602. In some embodiments, tuning is utilized when antenna bandwidth is not enough to cover the entire intended bandwidth. In some embodiments, the antenna structure 602 comprises a tank circuit comprising a capacitive element and an inductive element, as explained above with respect to FIG. 2*a* above. In some embodiments, the antenna tuning circuit 604 is coupled between a ground leg (e.g., the ground leg 208*b* in FIG. 2*a*) associated with the antenna structure 602 and an antenna ground circuit 606. In some embodiments, the antenna tuning circuit 604 may comprise one or more components configured to contribute a capacitance or an inductance, thereby enabling to modify an inductance of the ground leg associated with the antenna structure 602. In some embodiments, modifying an inductance of the ground leg enables to modify the resonant frequency of the antenna structure 602, in accordance with the equation (1) above. In some embodiments, the antenna tuning circuit 604 comprises a single capacitor or a single inductor, however, in other embodiments, the antenna tuning circuit 604 may comprise one or more components configured to contribute a capacitance or an inductance, to the inductance of the ground leg.

Figure 6B:
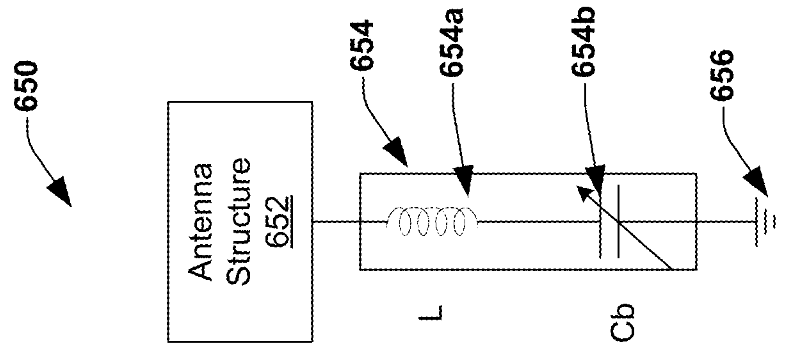
FIG. 6*b* illustrates an example implementation of an antenna tuning circuit, according to one embodiment of the disclosure.

FIG. 6*b* illustrates an example implementation of an antenna tuning circuit 654 associated with a wireless communication device 650, according to one embodiment of the disclosure. In some embodiments, the wireless communication device 650 is similar to the wireless communication device 600 in FIG. 6*a*. In some embodiments, the antenna tuning circuit 654 comprises one possible way of implementation of the antenna tuning circuit 604 in FIG. 6*a*. The antenna tuning circuit 654 is coupled between the antenna structure 652 and the antenna ground circuit 656, and is configured to modify an inductance associated with a ground leg of the antenna structure 652. The antenna tuning circuit 654 comprises a discrete inductor L 654*a* and a tunable capacitor Cb 654*b* having a tunable range. However, in other embodiments, the antenna tuning circuit 654 may be implemented differently, for example, by using a fixed capacitor, fixed inductor etc. In some embodiments, the tunable capacitor Cb 654*b* enables to modify an inductance contributed by the discrete inductor L 654*a*, in order to achieve a desirable tuning range of the antenna tuning circuit 654. In this embodiment, the tunable capacitor Cb 654*b* comprises a barium strontium titanate (BST) capacitor, the capacitance of which is varied in accordance with a varying DC voltage applied to it. However, in other embodiments, the tunable capacitor may be implemented differently, for example, by using a varactor diode.

In order to determine the dynamic range of the tunable capacitor Cb, in some embodiments, the desired net inductances to be contributed by the antenna tuning circuit 654 is determined by experiment. For example, in some embodiments, L1 is the lowest possible inductance to be contributed by the antenna tuning circuit 654 and L2 is the highest possible inductance to be contributed by the antenna tuning circuit 654, in order obtain a desired tunable range of the resonant frequency associated with the antenna structure 652. In order to select an appropriate tunable capacitor Cb, in some embodiments, a capacitor C having a tunable range between C1 and C2 is chosen. Upon choosing the capacitance C, a value of the discrete inductor L 654*a* is computed based on the equation below:

$$L = L_1 + \frac{1}{1 + C_1\omega_1^2} \tag{2}$$

Where C1 is the lowest tuning range of the capacitor Cb, L1 is the lowest possible inductance to be contributed by the antenna tuning circuit 654.

Upon determining L, Cb is determined based on determining an arbitrary capacitance Ck using the equation below:

$$C_k = \frac{1}{(L - L_2)\omega_2^2} \tag{3}$$

Where L2 is the highest possible inductance to be contributed by the antenna tuning circuit 654. In some embodiments, if the determined Ck<C2, the chosen capacitor C can be used as Cb in the antenna tuning circuit 654. However, if the determined Ck>C2, then a capacitor with a wider tuning range needs to be selected to be utilized as Cb in the antenna tuning circuit 654. Alternately, in some embodiments, if Ck>C2, the two capacitors having a capacitance C can be put in parallel, in order to get the desired tuning range. Alternately, in other embodiments, other possible methods of determining the value of the tunable capacitor Cb can also be utilized.

Figure 7:
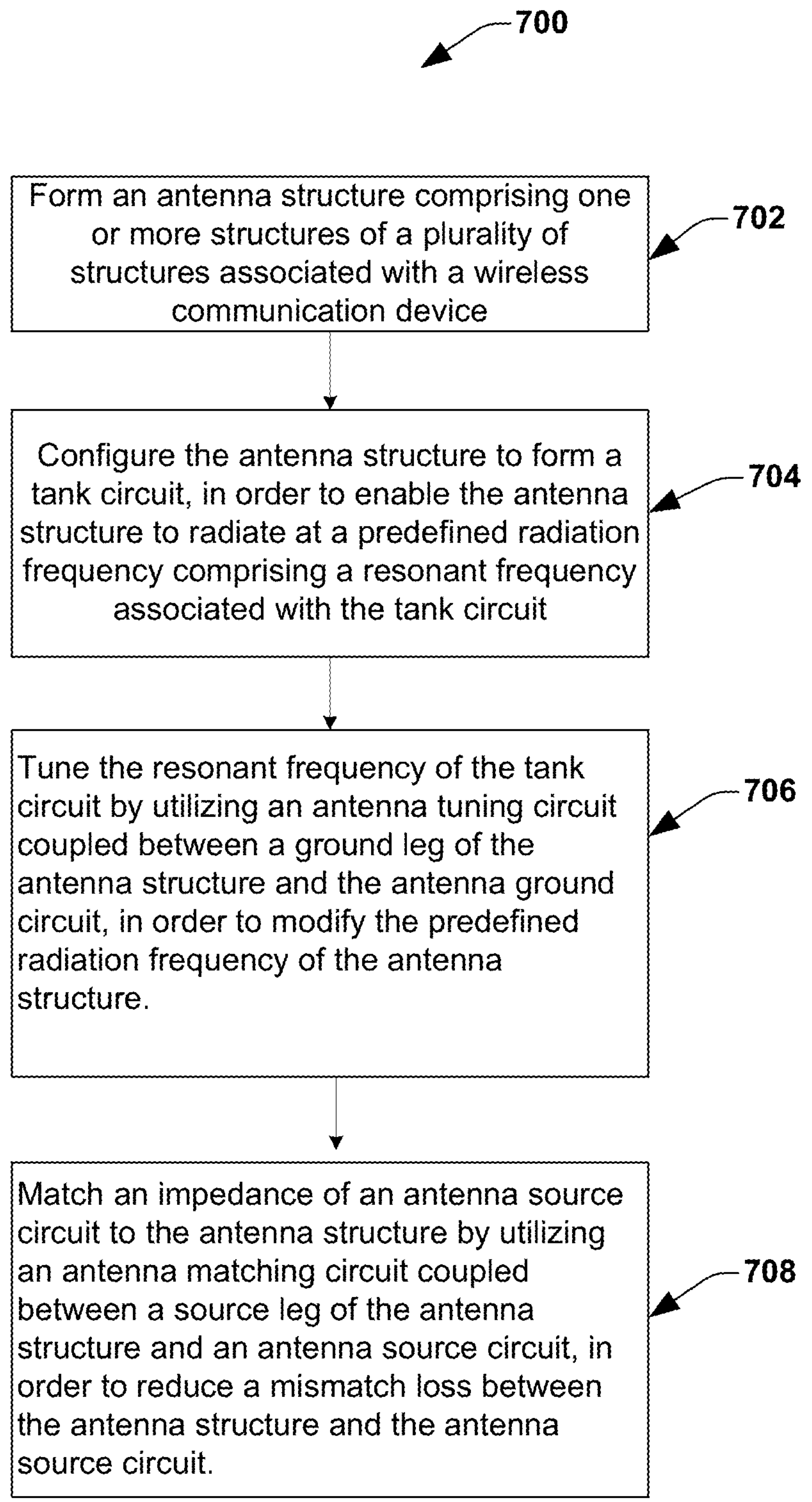
FIG. 7 illustrates a flow diagram of a method for a wireless communication device, according to one embodiment of the disclosure.

FIG. 7 illustrates a flow diagram of a method 700 for a wireless communication device, according to one embodiment of the disclosure. The method 700 is explained herein with reference to the wireless communication device 100 in FIG. 1 and the antenna structure 200 in FIG. 2*a*. However, in other embodiments, the method 700 can be applied to any wireless communication device, for example, the smart watch 400 in FIG. 4*a*. In some embodiments, the method 700 enables to configure one or more structures of a wireless communication device to be utilized as an antenna structure, thereby enabling to design efficient antennas in smaller wireless communication devices. At 702, an antenna structure (e.g., the antenna 102 in FIG. 1) comprised of one or more structures of a plurality of structures of a wireless communication device (e.g., the wireless communication device 100 in FIG. 1) is formed. In some embodiments, the antenna structure comprises a first plate (e.g., the first plate 202 in FIG. 2*a*) comprised of a first set of structures of the wireless communication device and a second plate (e.g., the second plate 204) comprised of a second, different, set of structures of the wireless communication device. In some embodiments, the antenna structure further comprises an excitation component (e.g., the excitation component 208 in FIG. 2*a*) coupled between the first plate and the second plate.

At 704, the antenna structure is configured to form a tank circuit, in order to enable the antenna structure to radiate at a predefined radiation frequency comprising a resonant frequency associated with the tank circuit. More specifically, in some embodiments, the first plate and the second plate associated with the antenna structure are configured to overlap and are spaced apart from one another, in order to enable the first plate and the second plate to form a capacitive element associated with the tank circuit. In some embodiments, the second plate is coupled to an antenna source circuit (e.g., the antenna source circuit 104 in FIG. 1) and the antenna ground circuit (e.g., the antenna ground circuit 106 in FIG. 1). Further, a first metallic pin (e.g., the first metallic pin 208*a* in FIG. 2*a*) associated with the excitation component is coupled to the second plate, in order to further couple to the antenna source circuit, thereby forming a source leg associated with the antenna structure.

In addition, a second metallic pin (e.g., the second metallic pin 208*b* in FIG. 2*a*) associated with the excitation component is coupled to the second plate, in order to further couple to the antenna ground circuit, thereby forming a ground leg associated with the antenna structure. In some embodiments, the ground leg forms an inductive element associated with the tank circuit. In some embodiment, the capacitive element comprised of the first plate and the second plate, and the inductive element comprised of the ground leg are parallel to one another, thereby enabling the tank circuit to resonate at a resonant frequency associated therewith. In some embodiments, the resonant frequency associated with the tank circuit is dictated by the equation (1) above. In some embodiments, the resonant frequency comprises the predefined radiation frequency comprising a global positioning system (GPS) frequency. However, other frequency ranges for the predefined frequency range, different from the GPS frequency, is also contemplated to be within the scope of this disclosure.

At 706, the resonant frequency of the tank circuit is tuned by utilizing an antenna tuning circuit (e.g., the antenna tuning circuit 110 in FIG. 1) coupled between the ground leg of the antenna structure and the antenna ground circuit. In some embodiments, tuning the resonant frequency of the tank circuit enables to modify the predefined radiation frequency of the antenna structure. In some embodiments, the antenna tuning circuit is coupled to the ground leg associated with the antenna structure, thereby modifying an impedance contributed by the ground leg. In some embodiments, the antenna tuning circuit may comprise one or more components configured to add a capacitance or inductance to the ground leg, in order to modify the impedance of the ground leg, as explained above with respect to FIG. 6*a* and FIG. 6*b* above. At 708, an impedance between an antenna source circuit and the antenna structure is matched by utilizing an antenna matching circuit (e.g., the antenna matching circuit 108 in FIG. 1) coupled between a source leg of the antenna structure and an antenna source circuit. In some embodiments, matching the impedance between the antenna source circuit and the antenna structure enables to reduce a mismatch loss between the antenna structure and the antenna source circuit. In some embodiments, reducing the mismatch loss enables to improve a power efficiency of the antenna structure. In some embodiments, the antenna matching circuit may comprise one or more components configured to match the impedance between the antenna source circuit and the antenna structure, as explained above with respect to FIG. 5.

While the methods are illustrated, and described above as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Figure 8:
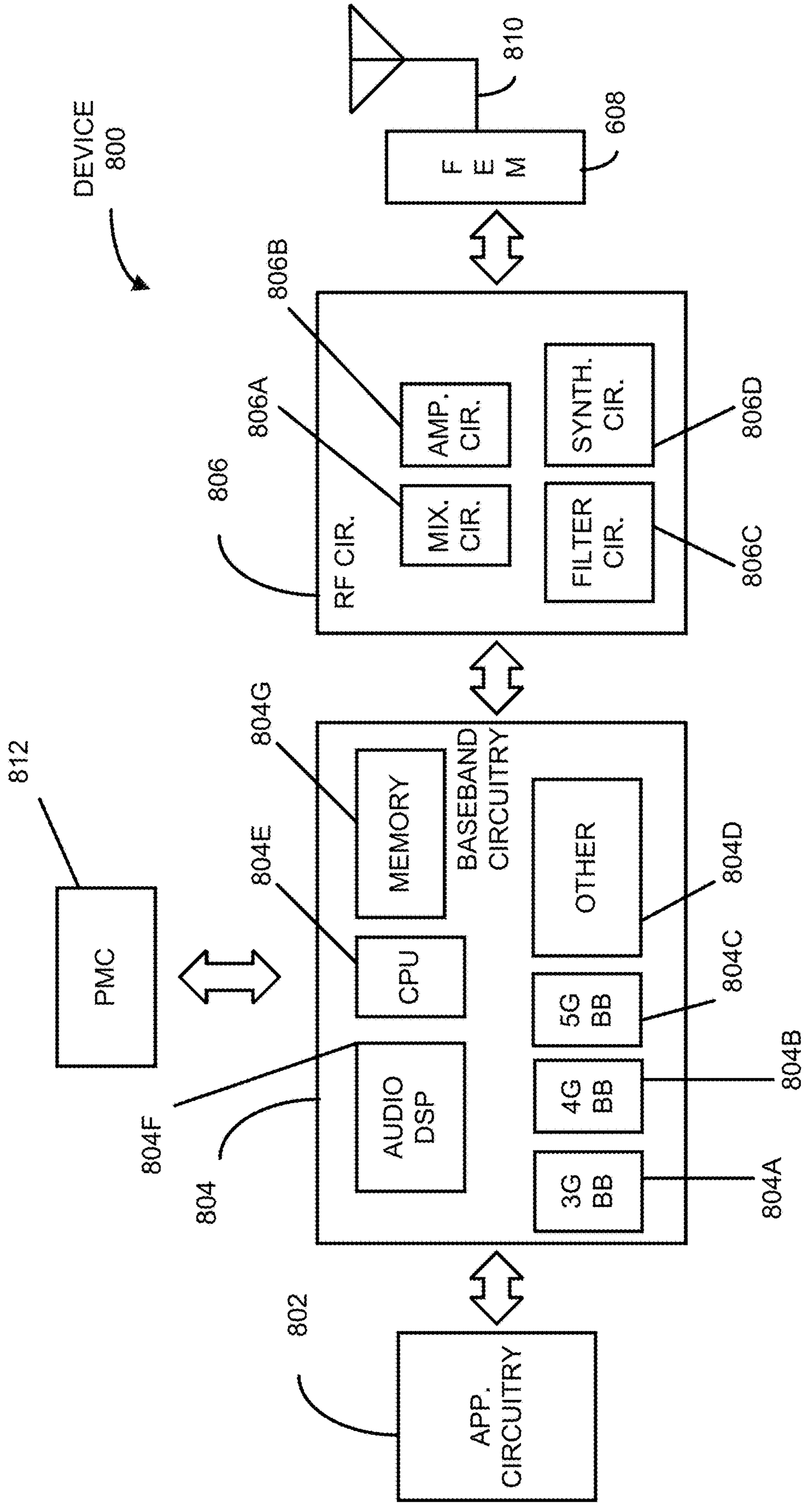
FIG. 8 illustrates example components of a device, in accordance with some embodiments.

FIG. 8 illustrates example components of a device 800 in accordance with some embodiments. In some embodiments, the device 800 may include application circuitry 802, baseband circuitry 804, Radio Frequency (RF) circuitry 806, front-end module (FEM) circuitry 808, one or more antennas 810, and power management circuitry (PMC) 812 coupled together at least as shown. The components of the illustrated device 800 may be included in a wireless communication device, for example, in user equipments (UEs) like mobile phone, smart watch etc. or a RAN node. In some embodiments, the wireless communication device 100 could comprise the components illustrated as part of the device 800. In some embodiments, the device 800 may include less elements (e.g., a RAN node may not utilize application circuitry 802, and instead include a processor/controller to process IP data received from an EPC). In some embodiments, the device 800 may include additional elements such as, for example, memory/storage, display, camera, sensor, or input/output (I/O) interfaln other embodiments, the components described below may be included in more than one device (e.g., said circuitries may be separately included in more than one device for Cloud-RAN (C-RAN) implementations).

The application circuitry 802 may include one or more application processors. For example, the application circuitry 802 may include circuitry such as, but not limited to, one or more single-core or multi-core processors. The processor(s) may include any combination of general-purpose processors and dedicated processors (e.g., graphics processors, application processors, etc.). The processors may be coupled with or may include memory/storage and may be configured to execute instructions stored in the memory/storage to enable various applications or operating systems to run on the device 800. In some embodiments, processors of application circuitry 802 may process IP data packets received from an EPC.

The baseband circuitry 804 may include circuitry such as, but not limited to, one or more single-core or multi-core processors. The baseband circuitry 804 may include one or more baseband processors or control logic to process baseband signals received from a receive signal path of the RF circuitry 806 and to generate baseband signals for a transmit signal path of the RF circuitry 806. Baseband processing circuitry 804 may interface with the application circuitry 802 for generation and processing of the baseband signals and for controlling operations of the RF circuitry 806. For example, in some embodiments, the baseband circuitry 804 may include a third generation (3G) baseband processor 804A, a fourth generation (4G) baseband processor 804B, a fifth generation (5G) baseband processor 804C, or other baseband processor(s) 804D for other existing generations, generations in development or to be developed in the future (e.g., second generation (2G), si8h generation (6G), etc.). The baseband circuitry 804 (e.g., one or more of baseband processors 804A-D) may handle various radio control functions that enable communication with one or more radio networks via the RF circuitry 806. In other embodiments, some or all of the functionality of baseband processors 804A-D may be included in modules stored in the memory 804G and executed via a Central Processing Unit (CPU) 804E. The radio control functions may include, but are not limited to, signal modulation/demodulation, encoding/decoding, radio frequency shifting, etc. In some embodiments, modulation/demodulation circuitry of the baseband circuitry 804 may include Fast-Fourier Transform (FFT), precoding, or constellation mapping/demapping functionality. In some embodiments, encoding/decoding circuitry of the baseband circuitry 804 may include convolution, tail-biting convolution, turbo, Viterbi, or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 804 may include one or more audio digital signal processor(s) (DSP) 804F. The audio DSP(s) 804F may be include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 804 and the application circuitry 802 may be implemented together such as, for example, on a system on a chip (SOC).

In some embodiments, the baseband circuitry 804 may provide for communication compatible with one or more radio technologies. For example, in some embodiments, the baseband circuitry 804 may support communication with an evolved universal terrestrial radio access network (EUTRAN) or other wireless metropolitan area networks (WMAN), a wireless local area network (WLAN), a wireless personal area network (WPAN). Embodiments in which the baseband circuitry 804 is configured to support radio communications of more than one wireless protocol may be referred to as multi-mode baseband circuitry.

RF circuitry 806 may enable communication with wireless networks using modulated electromagnetic radiation through a non-solid medium. In various embodiments, the RF circuitry 806 may include switches, filters, amplifiers, etc. to facilitate the communication with the wireless network. RF circuitry 806 may include a receive signal path which may include circuitry to down-convert RF signals received from the FEM circuitry 808 and provide baseband signals to the baseband circuitry 804. RF circuitry 806 may also include a transmit signal path which may include circuitry to up-convert baseband signals provided by the baseband circuitry 804 and provide RF output signals to the FEM circuitry 808 for transmission.

In some embodiments, the receive signal path of the RF circuitry 806 may include mixer circuitry 806*a*, amplifier circuitry 806*b* and filter circuitry 806*c*. In some embodiments, the transmit signal path of the RF circuitry 806 may include filter circuitry 806*c* and mixer circuitry 806*a*. RF circuitry 806 may also include synthesizer circuitry 806*d* for synthesizing a frequency for use by the mixer circuitry 806*a* of the receive signal path and the transmit signal path. In some embodiments, the mixer circuitry 806*a* of the receive signal path may be configured to down-convert RF signals received from the FEM circuitry 808 based on the synthesized frequency provided by synthesizer circuitry 806*d*. The amplifier circuitry 806*b* may be configured to amplify the down-converted signals and the filter circuitry 806*c* may be a low-pass filter (LPF) or band-pass filter (BPF) configured to remove unwanted signals from the down-converted signals to generate output baseband signals. Output baseband signals may be provided to the baseband circuitry 804 for further processing. In some embodiments, the output baseband signals may be zero-frequency baseband signals, although this is not a requirement. In some embodiments, mixer circuitry 806*a* of the receive signal path may comprise passive mixers, although the scope of the embodiments is not limited in this respect.

In some embodiments, the mixer circuitry 806*a* of the transmit signal path may be configured to up-convert input baseband signals based on the synthesized frequency provided by the synthesizer circuitry 806*d* to generate RF output signals for the FEM circuitry 808. The baseband signals may be provided by the baseband circuitry 804 and may be filtered by filter circuitry 806*c*.

In some embodiments, the mixer circuitry 806*a* of the receive signal path and the mixer circuitry 806*a* of the transmit signal path may include two or more mixers and may be arranged for quadrature downconversion and upconversion, respectively. In some embodiments, the mixer circuitry 806*a* of the receive signal path and the mixer circuitry 806*a* of the transmit signal path may include two or more mixers and may be arranged for image rejection (e.g., Hartley image rejection). In some embodiments, the mixer circuitry 806*a* of the receive signal path and the mixer circuitry 806*a* may be arranged for direct downconversion and direct upconversion, respectively. In some embodiments, the mixer circuitry 806*a* of the receive signal path and the mixer circuitry 806*a* of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 806 may include analog-to-digital converter (ADC) and digital-to-analog converter (DAC) circuitry and the baseband circuitry 804 may include a digital baseband interface to communicate with the RF circuitry 806.

In some dual-mode embodiments, a separate radio IC circuitry may be provided for processing signals for each spectrum, although the scope of the embodiments is not limited in this respect.

In some embodiments, the synthesizer circuitry 806*d* may be a fractional-N synthesizer or a fractional N/N+1 synthesizer, although the scope of the embodiments is not limited in this respect as other types of frequency synthesizers may be suitable. For example, synthesizer circuitry 806*d* may be a delta-sigma synthesizer, a frequency multiplier, or a synthesizer comprising a phase-locked loop with a frequency divider.

The synthesizer circuitry 806*d* may be configured to synthesize an output frequency for use by the mixer circuitry 806*a* of the RF circuitry 806 based on a frequency input and a divider control input. In some embodiments, the synthesizer circuitry 806*d* may be a fractional N/N+1 synthesizer.

In some embodiments, frequency input may be provided by a voltage controlled oscillator (VCO), although that is not a requirement. Divider control input may be provided by either the baseband circuitry 804 or the applications processor 802 depending on the desired output frequency. In some embodiments, a divider control input (e.g., N) may be determined from a look-up table based on a channel indicated by the applications processor 802.

Synthesizer circuitry 806*d* of the RF circuitry 806 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 806*d* may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 806 may include an IQ/polar converter.

FEM circuitry 808 may include a receive signal path which may include circuitry configured to operate on RF signals received from one or more antennas 810, amplify the received signals and provide the amplified versions of the received signals to the RF circuitry 806 for further processing. FEM circuitry 808 may also include a transmit signal path which may include circuitry configured to amplify signals for transmission provided by the RF circuitry 806 for transmission by one or more of the one or more antennas 810. In various embodiments, the amplification through the transmit or receive signal paths may be done solely in the RF circuitry 806, solely in the FEM 808, or in both the RF circuitry 806 and the FEM 808.

In some embodiments, the FEM circuitry 808 may include a TX/RX switch to switch between transmit mode and receive mode operation. The FEM circuitry may include a receive signal path and a transmit signal path. The receive signal path of the FEM circuitry may include an LNA to amplify received RF signals and provide the amplified received RF signals as an output (e.g., to the RF circuitry 806). The transmit signal path of the FEM circuitry 808 may include a power amplifier (PA) to amplify input RF signals (e.g., provided by RF circuitry 806), and one or more filters to generate RF signals for subsequent transmission (e.g., by one or more of the one or more antennas 810).

In some embodiments, the PMC 812 may manage power provided to the baseband circuitry 804. In particular, the PMC 812 may control power-source selection, voltage scaling, battery charging, or DC-to-DC conversion. The PMC 812 may often be included when the device 800 is capable of being powered by a battery, for example, when the device is included in a UE. The PMC 812 may increase the power conversion efficiency while providing desirable implementation size and heat dissipation characteristics.

While FIG. 8 shows the PMC 812 coupled only with the baseband circuitry 804. However, in other embodiments, the PMC 812 may be additionally or alternatively coupled with, and perform similar power management operations for, other components such as, but not limited to, application circuitry 802, RF circuitry 806, or FEM 808.

In some embodiments, the PMC 812 may control, or otherwise be part of, various power saving mechanisms of the device 800. For example, if the device 800 is in an RRC_Connected state, where it is still connected to the RAN node as it expects to receive traffic shortly, then it may enter a state known as Discontinuous Reception Mode (DRX) after a period of inactivity. During this state, the device 800 may power down for brief intervals of time and thus save power.

If there is no data traffic activity for an extended period of time, then the device 800 may transition off to an RRC_Idle state, where it disconnects from the network and does not perform operations such as channel quality feedback, handover, etc. The device 800 goes into a very low power state and it performs paging where again it periodically wakes up to listen to the network and then powers down again. The device 800 may not receive data in this state, in order to receive data, it must transition back to RRC_Connected state.

An additional power saving mode may allow a device to be unavailable to the network for periods longer than a paging interval (ranging from seconds to a few hours). During this time, the device is totally unreachable to the network and may power down completely. Any data sent during this time incurs a large delay and it is assumed the delay is acceptable.

Processors of the application circuitry 802 and processors of the baseband circuitry 804 may be used to execute elements of one or more instances of a protocol stack. For example, processors of the baseband circuitry 804, alone or in combination, may be used execute Layer 3, Layer 2, or Layer 1 functionality, while processors of the application circuitry 804 may utilize data (e.g., packet data) received from these layers and further execute Layer 4 functionality (e.g., transmission communication protocol (TCP) and user datagram protocol (UDP) layers). As referred to herein, Layer 3 may comprise a radio resource control (RRC) layer, described in further detail below. As referred to herein, Layer 2 may comprise a medium access control (MAC) layer, a radio link control (RLC) layer, and a packet data convergence protocol (PDCP) layer, described in further detail below. As referred to herein, Layer 1 may comprise a physical (PHY) layer of a UE/RAN node, described in further detail below.

While the apparatus has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a wireless communication device comprised of a plurality of structures configured to enable structural, functional or cosmetic functions associated with the device, comprising an antenna structure configured to radiate at a predefined radiation frequency, the antenna structure comprising a first plate comprised of a first set of structures of the plurality of structures of the device; and a second, different, plate comprised of a second set of structures of the plurality of structures of the device, wherein the first plate and the second plate are spaced apart from one another, and wherein the first plate and the second plate overlap, at least partially.

Example 2 is a device, including the subject matter of example 1, wherein the antenna structure further comprises an excitation component coupled between the first plate and the second plate, wherein the first plate, the second plate and at least a part of the excitation component are configured to form a tank circuit having a resonant frequency associated therewith, in order to enable the antenna structure to radiate at the resonant frequency comprising the predefined radiation frequency.

Example 3 is a device, including the subject matter of examples 1-2, including or omitting elements, wherein the second plate comprises, at least partly, a structure coupled to an antenna ground circuit and an antenna source circuit associated with the device.

Example 4 is a device, including the subject matter of examples 1-3, including or omitting elements, wherein the excitation component comprises a source leg comprising a first metallic pin coupled between the first plate and the second plate, and configured to be coupled to the antenna source circuit via the second plate.

Example 5 is a device, including the subject matter of examples 1-4, including or omitting elements, wherein the excitation component further comprises a ground leg comprising a second metallic pin coupled between the first plate and the second plate, and configured to be coupled to the antenna ground circuit via the second plate, thereby enabling the ground leg to form an inductive element associated with the tank circuit.

Example 6 is a device, including the subject matter of examples 1-5, including or omitting elements, further comprising an antenna matching circuit comprising a series resistor coupled between the source leg of the antenna structure and the antenna source circuit, and configured to match an impedance between the antenna source circuit and the antenna structure, in order to reduce a mismatch loss between the antenna source circuit and the antenna structure.

Example 7 is a device, including the subject matter of examples 1-6, including or omitting elements, further comprising an antenna tuning circuit coupled between the ground leg of the antenna structure and the antenna ground circuit, and configured to modify an impedance of the ground leg, in order to tune the resonant frequency of the tank circuit, thereby enabling to modify the predefined radiation frequency of the antenna structure.

Example 8 is a device, including the subject matter of examples 1-7, including or omitting elements, wherein the second plate comprises a printed circuit board (PCB) comprising the antenna source circuit and the antenna ground circuit.

Example 9 is a device, including the subject matter of examples 1-8, including or omitting elements, wherein the excitation component is coupled between the first plate and a non-conductive area along a periphery of the PCB.

Example 10 is a device, including the subject matter of examples 1-9, including or omitting elements, wherein the predefined radiation frequency comprises a global positioning system (GPS) frequency.

Example 11 is a device, including the subject matter of examples 1-10, including or omitting elements, wherein the first metallic pin and the second metallic pin are coupled to the first plate and the second plate at positions along a periphery of the first plate and the second plate, and wherein a relative position of the first metallic pin and the second metallic pin with respect to one another determines an inductance contributed by the ground leg, in order to tune the resonant frequency of the tank circuit.

Example 12 is an antenna structure associated with a wireless communication device comprised of a plurality of structures configured to enable structural, functional or cosmetic functions associated with the device, comprising a first plate comprised of a first set of structures of the plurality of structures of the device;

a second, different, plate comprised of a second set of structures of the plurality of structures of the device, wherein the first plate and the second plate are spaced apart from one another, and wherein the first plate and the second plate overlap, at least partially, and wherein the first plate and the second plate are at least partially planar; and an excitation component coupled between the first plate and the second plate; wherein the first plate, the second plate and at least a part of the excitation component are configured to form a tank circuit, in order to enable the antenna structure to radiate at a predefined radiation frequency comprising a resonant frequency associated with the tank circuit.

Example 13 is a structure, including the subject matter of example 12, wherein the first plate comprises a conductive structure of the device.

Example 14 is a structure, including the subject matter of examples 12-13, including or omitting elements, wherein the first plate comprises, at least partly, an outer conductive structure of the device.

Example 15 is a structure, including the subject matter of examples 12-14, including or omitting elements, wherein the second plate comprises, at least partly, a structure coupled to an antenna source circuit and an antenna ground circuit associated with the device, and wherein the first plate and the second plate together form a capacitive element associated with the tank circuit.

Example 16 is a structure, including the subject matter of examples 12-15, including or omitting elements, wherein the second plate comprises, at least partly, a printed circuit board (PCB) comprising the antenna source circuit and the antenna ground circuit associated with the device.

Example 17 is a structure, including the subject matter of examples 12-16, including or omitting elements, wherein the excitation component comprises a source leg comprising a first metallic pin coupled between the first plate and the second plate, and configured to be coupled to the antenna source circuit via the second plate.

Example 18 is a structure, including the subject matter of examples 12-17, including or omitting elements, wherein the excitation component further comprises a ground leg comprising a second metallic pin coupled between the first plate and the second plate, and configured to be coupled to the antenna ground circuit via the second plate, wherein the ground leg forms an inductive element associated with the tank circuit.

Example 19 is a structure, including the subject matter of examples 12-18, including or omitting elements, wherein the source leg is configured to couple to an antenna matching circuit coupled to the antenna source circuit, prior to coupling to the antenna source circuit, wherein the antenna matching circuit is configured to match an impedance between the antenna source circuit and the antenna structure, in order to reduce a mismatch loss between the antenna source circuit and the antenna structure.

Example 20 is a structure, including the subject matter of examples 12-19, including or omitting elements, wherein the ground leg is configured to couple to an antenna tuning circuit coupled to the antenna ground circuit, prior to coupling to the antenna ground circuit, wherein the antenna tuning circuit is configured to modify an impedance of the ground leg, in order to tune the resonant frequency of the tank circuit thereby enabling to modify the predefined radiation frequency of the antenna structure.

Example 21 is an antenna structure associated with a wireless communication device comprising a first plate having an at least partially planar structure; a second, different, plate having an at least partially planar structure, wherein the first plate and the second plate are spaced apart from one another, and wherein the first plate and the second plate overlap, at least partially; and an excitation component coupled between the first plate and the second plate; wherein the first plate, the second plate and at least a part of the excitation component are configured to form a tank circuit, in order to enable the antenna structure to radiate at a predefined radiation frequency comprising a resonant frequency associated with the tank circuit.

Example 22 is a structure, including the subject matter of example 21, wherein the first plate comprises a conductive structure.

Example 23 is a structure, including the subject matter of examples 21-22, including or omitting elements, wherein the second plate comprises, at least partly, a structure coupled to an antenna source circuit and an antenna ground circuit associated with the wireless communication device, and wherein the first plate and the second plate together form a capacitive element associated with the tank circuit.

Example 24 is a structure, including the subject matter of examples 21-23, including or omitting elements, wherein the excitation component comprises a source leg comprising a first metallic pin coupled between the first plate and the second plate, and configured to be coupled to the antenna source circuit via the second plate.

Example 25 is a structure, including the subject matter of examples 21-24, including or omitting elements, wherein the excitation component further comprises a ground leg comprising a second metallic pin coupled between the first plate and the second plate, and configured to be coupled to the antenna ground circuit via the second plate, wherein the ground leg forms an inductive element associated with the tank circuit.

Example 26 is a structure, including the subject matter of examples 21-25, including or omitting elements, wherein the source leg is configured to couple to an antenna matching circuit coupled to the antenna source circuit, prior to coupling to the antenna source circuit, wherein the antenna matching circuit is configured to match an impedance between the antenna source circuit and the antenna structure, in order to reduce a mismatch loss between the antenna source circuit and the antenna structure.

Example 27 is a structure, including the subject matter of examples 21-26, including or omitting elements, wherein the ground leg is configured to couple to an antenna tuning circuit coupled to the antenna ground circuit, prior to coupling to the antenna ground circuit, wherein the antenna tuning circuit is configured to modify an impedance of the ground leg, in order to tune the resonant frequency of the tank circuit thereby enabling to modify the predefined radiation frequency of the antenna structure.

Example 28 is a structure, including the subject matter of examples 21-27, including or omitting elements, wherein the first plate and the second plate are comprised of one or more structures of a plurality of structures of the wireless communication device, wherein the plurality of structures of the wireless communication device are configured to enable structural, functional or cosmetic functions associated with the wireless communication device.

Example 29 is a method for a wireless communication device comprised of a plurality of structures configured to enable structural, functional or cosmetic functions associated with the device, comprising forming an antenna structure comprising a first plate comprised of a first set of structures of the plurality of structures of the device; a second, different, plate comprised of a second set of structures of the plurality of structures of the device, wherein the first plate and the second plate are spaced apart from one another, and wherein the first plate and the second plate overlap, at least partially; and an excitation component comprising a first metallic pin and a second, different metallic pin coupled between the first plate and the second plate; and configuring the first plate, the second plate and at least a part of the excitation component to form a tank circuit, in order to enable the antenna structure to radiate at a predefined radiation frequency comprising a resonant frequency associated with the tank circuit.

Example 30 is a method, including the subject matter of examples 29, wherein the first plate comprises, at least partly, a conductive structure of the device.

Example 31 is a method, including the subject matter of examples 29-30, including or omitting elements, wherein the second plate comprises, at least partly, a structure coupled to an antenna source circuit and an antenna ground circuit associated with the device, wherein the first plate and the second plate together form a capacitive element associated with the tank circuit.

Example 32 is a method, including the subject matter of examples 29-31, including or omitting elements, wherein the first metallic pin comprises a source leg coupled between the first plate and the second plate, and configured to be coupled to the antenna source circuit, via the second plate.

Example 33 is a method, including the subject matter of examples 29-32, including or omitting elements, wherein the second metallic pin comprises a ground leg coupled between the first plate and the second plate, and configured to be coupled to the antenna ground circuit, via the second plate, wherein the ground leg forms an inductive element associated with the tank circuit.

Example 34 is a method, including the subject matter of examples 29-33, including or omitting elements, further comprising tuning the resonant frequency of the tank circuit based on modifying an impedance of the ground leg by utilizing an antenna tuning circuit coupled between the ground leg of the antenna structure and the antenna ground circuit, thereby enabling to modify the predefined radiation frequency of the antenna structure.

Example 35 is a method, including the subject matter of examples 29-34, including or omitting elements, further comprising matching an impedance of the antenna source circuit to the antenna structure, based on utilizing an antenna matching circuit comprising a series resistor coupled between the source leg of the antenna structure and the antenna source circuit, in order to reduce a mismatch loss between the antenna structure and the antenna source circuit.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A wireless communication device having a plurality of structures configured to enable structural, functional or cosmetic functions associated with the wireless communication device, comprises:

a transmitter circuitry; and an antenna structure communicatively coupled to the transmitter circuitry and configured to radiate at a predefined radiation frequency, the antenna structure comprising:

a first plate having a first set of structures of the plurality of structures a second plate spaced apart from and partially overlapping the first plate, and having a second set of structures of the plurality of structures; and an excitation component coupled between the first plate and the second plate;

wherein the first plate, the second plate and at least a part of the excitation component form a tank circuit having a resonant frequency comprising the predefined radiation frequency.

2. The wireless communication device of claim 1, wherein the second plate is coupled to an antenna ground circuit and an antenna source circuit associated with the wireless communication device.

3. The wireless communication device of claim 2, wherein the excitation component comprises a source leg comprising a first metallic pin coupled between the first plate and the second plate, and configured to be coupled to the antenna source circuit via the second plate.

4. The wireless communication device of claim 3, wherein the excitation component further comprises a ground leg comprising a second metallic pin coupled between the first plate and the second plate, and configured to be coupled to the antenna ground circuit via the second plate, thereby enabling the ground leg to form an inductive element associated with the tank circuit.

5. The wireless communication device of claim 4, further comprising an antenna tuning circuit coupled between the ground leg of the antenna structure and the antenna ground circuit, and configured to modify an impedance of the ground leg, in order to tune the resonant frequency of the tank circuit, thereby enabling to modify the predefined radiation frequency of the antenna structure.

6. The wireless communication device of claim 4, wherein the first metallic pin and the second metallic pin are coupled to the first plate and the second plate at positions along a periphery of the first plate and the second plate, and wherein a relative position of the first metallic pin and the second metallic pin with respect to one another determines an inductance contributed by the ground leg, in order to tune the resonant frequency of the tank circuit.

7. The wireless communication device of claim 3, further comprising an antenna matching circuit comprising a series resistor coupled between the source leg of the antenna structure and the antenna source circuit, and configured to match an impedance between the antenna source circuit and the antenna structure, in order to reduce a mismatch loss between the antenna source circuit and the antenna structure.

8. The wireless communication device of claim 2, wherein the second plate comprises a printed circuit board (PCB) comprising the antenna source circuit and the antenna ground circuit.

9. The wireless communication device of claim 8, wherein the excitation component is coupled between the first plate and a non-conductive area along a periphery of the PCB.

10. The wireless communication device of claim 1, wherein the predefined radiation frequency comprises a global positioning system (GPS) frequency.

11. An antenna structure associated with a wireless communication device comprised of a plurality of structures configured to enable structural, functional or cosmetic functions associated with the wireless communication device, comprising:

a first plate having a first set of structures of the plurality of structures;

a second plate spaced apart from and partially overlapping the first plate, and having a second set of structures of the plurality of structures, wherein the first plate and the second plate are at least partially planar; and an excitation component coupled between the first plate and the second plate, wherein the first plate, the second plate, and at least a part of the excitation component form a tank circuit.

12. The antenna structure of claim 11, wherein the first plate comprises a conductive structure of the wireless communication device.

13. The antenna structure of claim 12, wherein the first plate comprises, at least partly, an outer conductive structure of the wireless communication device.

14. The antenna structure of claim 12, wherein the second plate is coupled to an antenna source circuit and an antenna ground circuit associated with the wireless communication device, and wherein the first plate and the second plate together form a capacitive element associated with the tank circuit.

15. The antenna structure of claim 14, wherein the second plate comprises, at least partly, a printed circuit board (PCB) comprising the antenna source circuit and the antenna ground circuit associated with the wireless communication device.

16. The antenna structure of claim 14, wherein the excitation component comprises a source leg comprising a first metallic pin coupled between the first plate and the second plate, and configured to be coupled to the antenna source circuit via the second plate.

17. The antenna structure of claim 16, wherein the excitation component further comprises a ground leg comprising a second metallic pin coupled between the first plate and the second plate, and configured to be coupled to the antenna ground circuit via the second plate, wherein the ground leg forms an inductive element associated with the tank circuit.

18. The antenna structure of claim 16, wherein the source leg is configured to couple to an antenna matching circuit coupled to the antenna source circuit, prior to coupling to the antenna source circuit, wherein the antenna matching circuit is configured to match an impedance between the antenna source circuit and the antenna structure, in order to reduce a mismatch loss between the antenna source circuit and the antenna structure.

19. The antenna structure of claim 17, wherein the ground leg is configured to couple to an antenna tuning circuit coupled to the antenna ground circuit, prior to coupling to the antenna ground circuit, wherein the antenna tuning circuit is configured to modify an impedance of the ground leg, in order to tune a resonant frequency of the tank circuit thereby enabling to modify a predefined radiation frequency of the antenna structure.

20. An antenna structure for a wireless communication device comprises:

a first plate having an at least partially planar structure;

a second plate spaced apart from and at least partially overlapping the first plate, the second plate having an at least partially planar structure; and an excitation component coupled between the first plate and the second plate;

wherein the first plate, the second plate and at least a part of the excitation component are configured to form a tank circuit, in order to enable the antenna structure to radiate at a predefined radiation frequency comprising a resonant frequency associated with the tank circuit.

21. The antenna structure of claim 20, wherein the first plate comprises a conductive structure.

22. The antenna structure of claim 21, wherein the second plate comprises, at least partly, a structure coupled to an antenna source circuit and an antenna ground circuit associated with the wireless communication device, and wherein the first plate and the second plate together form a capacitive element associated with the tank circuit.

23. The antenna structure of claim 22, wherein the excitation component comprises a source leg comprising a first metallic pin coupled between the first plate and the second plate, and configured to be coupled to the antenna source circuit via the second plate.

24. The antenna structure of claim 23, wherein the excitation component further comprises a ground leg comprising a second metallic pin coupled between the first plate and the second plate, and configured to be coupled to the antenna ground circuit via the second plate, wherein the ground leg forms an inductive element associated with the tank circuit.

* * * * *